United States Patent
Wei

(10) Patent No.: US 6,434,002 B1
(45) Date of Patent: Aug. 13, 2002

(54) STRUCTURE COMPUTER HEAT DISSIPATER

(76) Inventor: Wen-Chen Wei, P.O. Box No. 6-57, Chung-Ho City, Taipei Hsien, 235 (TW)

( * ) Notice: Subject to any disclaimer, the term of this patent is extended or adjusted under 35 U.S.C. 154(b) by 0 days.

(21) Appl. No.: 09/629,447

(22) Filed: Jul. 31, 2000

(51) Int. Cl.[7] .............................. G06F 1/16; H05K 7/20
(52) U.S. Cl. ...................... 361/697; 361/691; 361/694; 361/695; 361/696; 415/176; 123/41.7
(58) Field of Search .................................. 361/688–697, 361/702–704, 709–714; 165/80.3, 121, 122, 185, 104.33; 123/41.66, 41.7, 41.56, 41.65; 415/176–178; 257/706, 707, 718, 719, 727; 174/16.3

(56) References Cited

U.S. PATENT DOCUMENTS

| | | | | |
|---|---|---|---|---|
| 4,841,920 A | * | 6/1989 | Andreasson et al. ..... 123/41.66 |
| 5,727,624 A | * | 3/1998 | Ko et al. ..................... 165/121 |
| 5,828,551 A | * | 10/1998 | Hoshino et al. ............ 361/697 |
| 5,953,208 A | * | 9/1999 | Katsui ......................... 361/697 |
| 6,118,658 A | * | 9/2000 | Nakase ........................ 361/697 |
| 6,137,681 A | * | 10/2000 | Lu .............................. 361/697 |

* cited by examiner

*Primary Examiner*—Gerald Tolin
*Assistant Examiner*—Yean-Hsi Chang

(57) ABSTRACT

An improved structure computer heat dissipater, the heat sink base of which has four lateral walls of appropriate length with a plurality of draft guide ducts cut inward through them. The cut surfaces thereof are utilized as flow direction separators set to a particular angular arrangement to create a predetermined air flow path. Disposed on the bottom plate are thermal dissipation protuberances that collect the concentrated thermal energy developed by the heat generating electronic component in a computer. The air stream drawn in by the fan conveys the heat absorbed by the thermal dissipation protuberances along the air path formed by the flow direction separators and rapidly discharges it through the draft guide ducts.

2 Claims, 3 Drawing Sheets

STRUCTURE COMPUTER HEAT DISSIPATER

BACKGROUND OF THE INVENTION

1) Field of the Invention

The invention herein relates to an improved structure computer heat dissipater having draft guide ducts cut into the heat sink base to form flow direction separators disposed at different angles, with thermal dissipation protuberances situated in front of the draft guide ducts such that the fan is provided a rapid air flow path to dissipate thermal energy and effectively lower temperature thereby.

2) Description of the Prior Art

To solve the problem of internal computer component overheating, a heat dissipation fixture is often installed onto the heat generating electronic component so that the heat dissipation fixture conducts and disperses the thermal energy resulting from the high temperature characteristic of such electronic components. A conventional heat dissipation fixture, as indicated in FIG. 1, has heat dissipation columns 2 disposed on the heat sink bottom plate 1 and, furthermore, the bottom plate 1 is firmly pressed against the heat generating electronic component such that the thermal energy from the high temperatures produced during electronic component operation is conducted and dispersed by the heat dissipation columns 2. Although the production costs of such types of heat dissipation fixtures are inexpensive, the rate of conductance is comparatively slow, making them only suitable for low operating speed computers; for high speed or prolonged utilization heat generating electronic components, their heat dissipation performance is limited and less than ideal. Another variety of heat dissipation fixture is equipped with a cooling fan and, as indicated in FIG. 2, a nested recess is formed in the center of the heat sink fins 4 for the additional installation of the fan 5, with hot air discharge openings 6 at the separation channels along the four sides; when such heat dissipation fixtures are installed on the surface of a heat generating electronic component and the fan 5 starts to rotate, cool external air is drawn in from the vent opening 7 and blown over the heat sink fins 4, with the thermal energy emanation transferred upward from the electronic component then conveyed through the hot air discharge openings 6 to achieve heat dissipation performance. However, in this type of heat dissipation fixture, since the interior ends of the channel-shaped hot air discharge openings 6 are flat surfaced and vertical, reverse air obstruction and fan air stream impeding easily results in laminar lag that traps and concentrates the heat source in the heat fins and at the fan, which reduces fan efficiency and does not yield effective heat dissipation performance.

In view of the shortcomings in the structural design of the said conventional heat sink fixtures, the inventor of the invention herein extensively studied various remedial approaches that, following continuous research and refinements, culminated in the development of the improved structure heat dissipater of the present invention. Generally, the invention herein consists of a heat sink base that is a square with a built-in recess and four lateral walls of appropriate length each having cut inward through them a plurality of draft guide ducts, and the cut surfaces thereof are bent towards the right at different included angles of 90 degrees, 65 degrees, and 45 degrees as flow direction separators according to the air flow direction and, as such, when the fan draws in an air stream, since the disruption of the flow direction separators breaks up the whirling air stream so impelled, this prevents deflective collisions and the generation of reverse flow, with their included angles also serving to reduce the area of flow as well as increase the air stream and pressure through the draft guide ducts to thereby accelerate air stream flow speed such that the air stream drawn in by the fan subjected to the orienting effect of the flow direction separators circulates rapidly and continuously without producing drag; furthermore, disposed on the bottom plate of the heat sink base are thermal dissipation protuberances that serve to collect the concentrated heat developed by the heat generating electronic component in a computer, and the thermal dissipation protuberances are positioned within the air path created by the flow direction separators such that the air stream oriented by the flow direction separators contacts the thermal dissipation protuberances and the heat absorbed by the thermal dissipation protuberances is rapidly discharged through the draft guide ducts to afford full fan performance and optimal heat dissipation application to thereby remedy computer component overheating problems.

SUMMARY OF THE INVENTION

Therefore, the primary objective of the invention herein is to provide an improved structure computer heat dissipater in which a plurality of draft guide ducts are cut inward though each of the four lateral walls of the heat sink base, with their cut surfaces each disposed at a set angle to form flow direction separators according to the air flow direction such that the air stream drawn in by the fan subjected to the orienting effect of the flow direction separators circulates rapidly and smoothly without the occurrence of drag.

Another objective of the invention herein is to provide an improved structure computer heat dissipater in which disposed on the bottom plate of the heat sink base are thermal dissipation protuberances that serve to collect the concentrated heat developed by the heat generating electronic component in a computer, and the thermal dissipation protuberances are positioned within the air path created by the flow direction separators such that when the fan draws in an air stream, contact with the thermal dissipation protuberances is increased and the heat absorbed by the thermal dissipation protuberances is conveyed along the air path and rapidly discharged through the draft guide ducts.

Yet another objective of the invention herein is to provide an improved structure computer heat dissipater in which projecting horizontally from the two sides at the upper ends of the lateral walls are tabs that facilitate assembly to the cover via latch posts having a hook at their lower ends; as such, no screws are utilized and both assembly and disassembly are rapid and simple.

In achieving the said objectives of the invention herein, the technological means and overall structural innovations are disclosed to demonstrate the most feasible embodiments and, furthermore, the brief description of the drawings below and the following detailed description of the invention will enable a further understanding of the present invention.

DETAILED DESCRIPTION OF THE INVENTION

Figure 1:
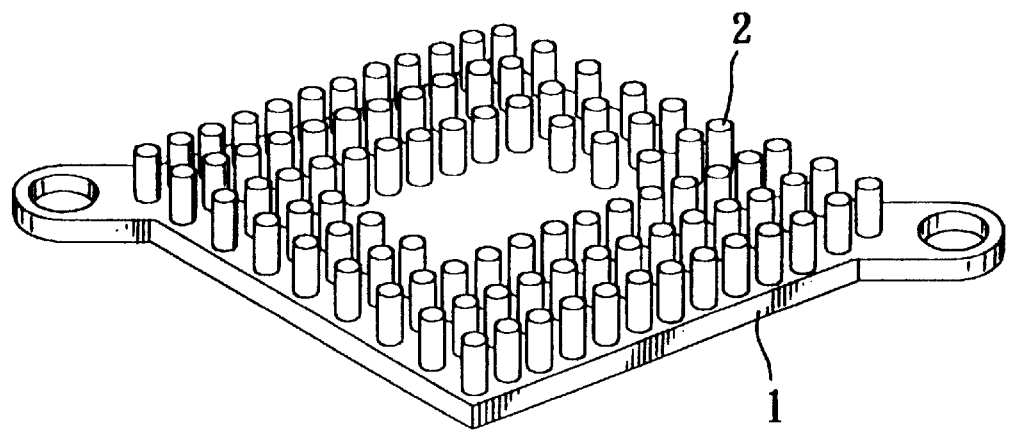
FIG. 1 is an isometric drawing of a conventional heat dissipation fixture.
Figure 2:
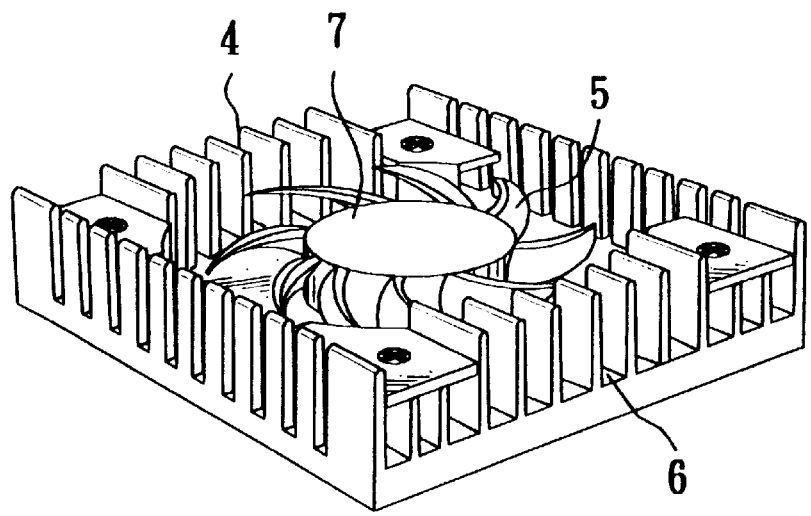
FIG. 2 is an isometric drawing of another heat dissipation fixture.
Figure 3:
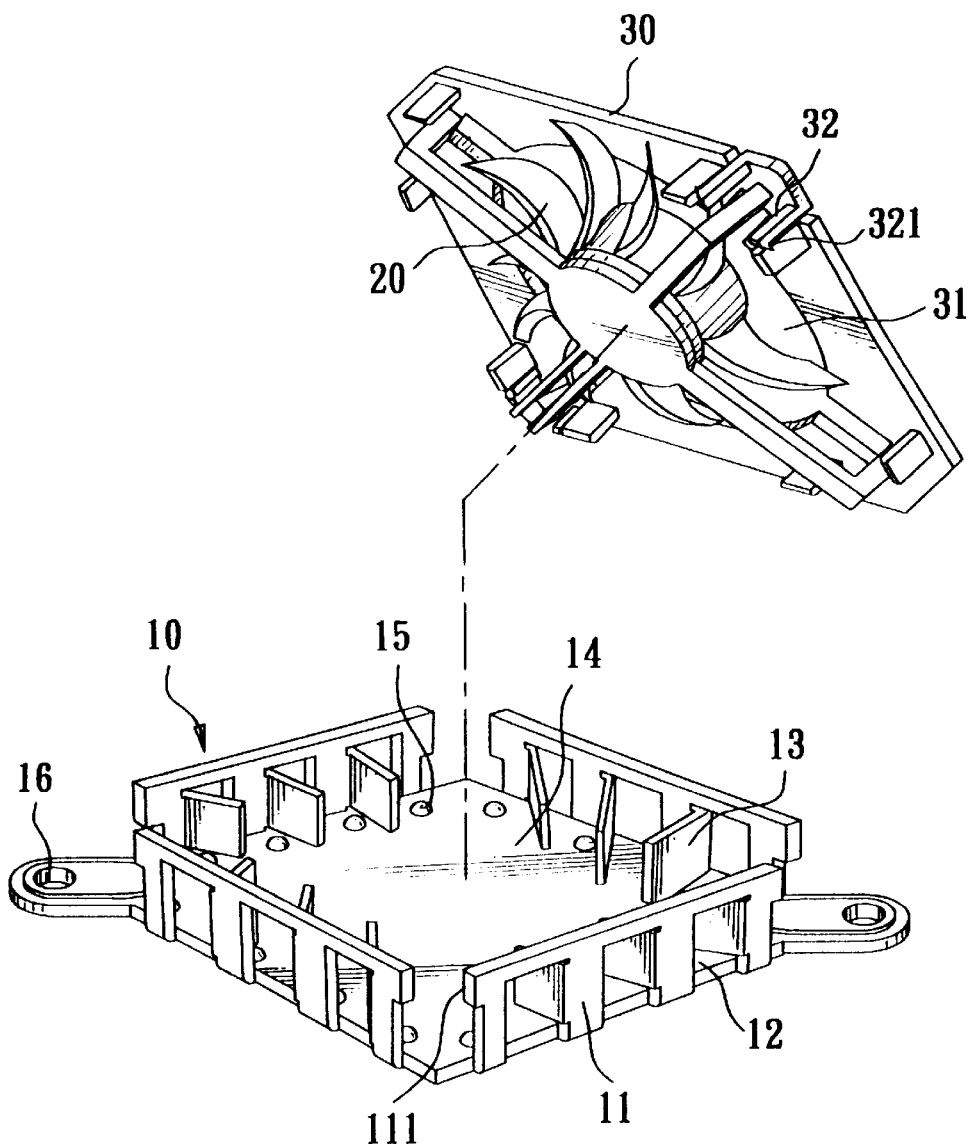
FIG. 3 is an exploded drawing of the invention herein.

Referring to FIG. 3, the exploded drawing of the invention herein, the present invention is comprised of a heat sink base 10, a fan 20, and a cover 30; mounting holes 16 are formed in the said heat sink base 10 through which are inserted threaded studs for securing to a heat generating electronic component of a computer. Of which:

The said heat sink base 10. has a recess formed in the center for the installation of the fan 20 and a plurality of draft guide ducts 12 cut inward through its four lateral walls 11, with the cut surfaces thereof bent towards the right to form flow direction separators 13 and, furthermore, the said flow direction separators 13 are oriented according to different included angles ranging from approximately 90 degrees to 45 degrees relative to the rotational direction of the fan 20 such that the whirling air stream impelled by the spinning fan 20 is broken up by flow separators 13 which cause the smooth circulation of the air stream, with the included angle arrangement of the flow direction separators 13 at the same time also reducing the area of flow, increasing the air pressure towards the draft guide ducts 12 and, furthermore, accelerating draft guide duct 12 discharge without producing drag; disposed on the bottom plate 14 of the heat sink base 10 are thermal dissipation protuberances 15 that collect the concentrated heat source developed by the heat generating electronic component in a computer, with each thermal dissipation protuberance 15 situated at the front extent of a draft guide duct 12 and, furthermore, positioned within the air path created by the flow direction separators 13 such that the air stream impelled by the rotation of the fan 20 rapidly discharges the heat absorbed by the thermal dissipation protuberances 15 through the draft guide ducts 12 to achieve full heat dissipation performance.

Since the four lateral walls 11 of the said heat sink base 10 are not completely convergent, an opening is formed at each of the corner sections and, furthermore, projecting horizontally from the two sides at the upper ends of each lateral wall 11 are tabs 111 that facilitate assembly to the cover 30 via latch posts 32 each having a hook 321 at their lower ends; the said fan 20 is pivotably installed between the cover 30 and the heat sink base 10; an air intake opening 31 is formed in the top surface of the said cover 30 and a latch post 32 extends downward from each of its two diagonally opposed corners, with each latch post 32 having an outwardly projecting hook 321 that engages the tabs 111 of the lateral walls 11 such that during assembly, no screws are utilized and it is only necessary to effect downward pressure to complete the engagement and to disassemble, manual pressure is applied to the top ends of the latch posts 32 such that the hooks 321 at their lower ends are released downward, thereby allowing efficient disassembly and extremely convenient assembly and disassembly.

Figure 4:
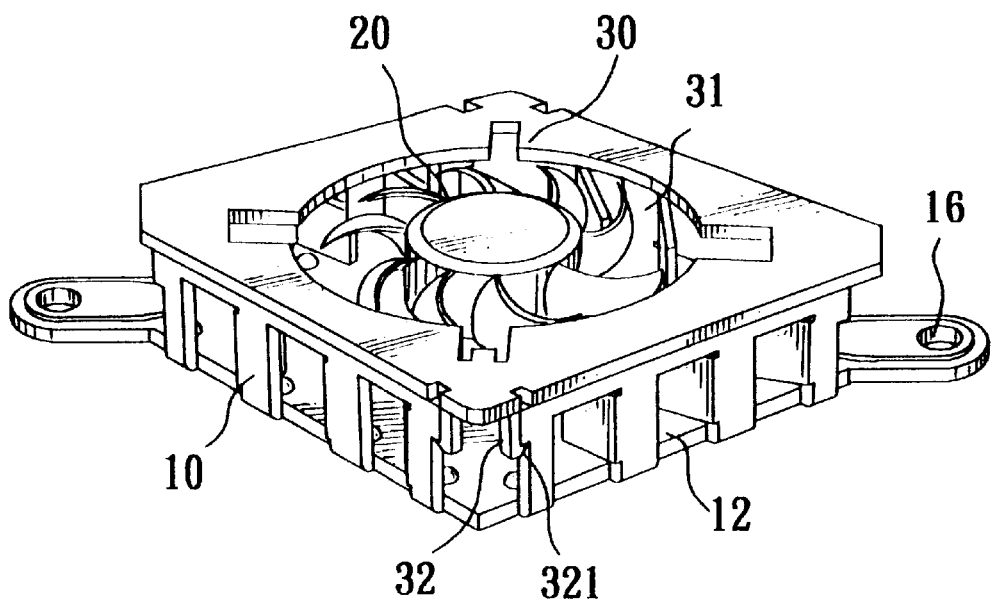
FIG. 4 is an isometric drawing of the assembled invention herein.
Figure 5:
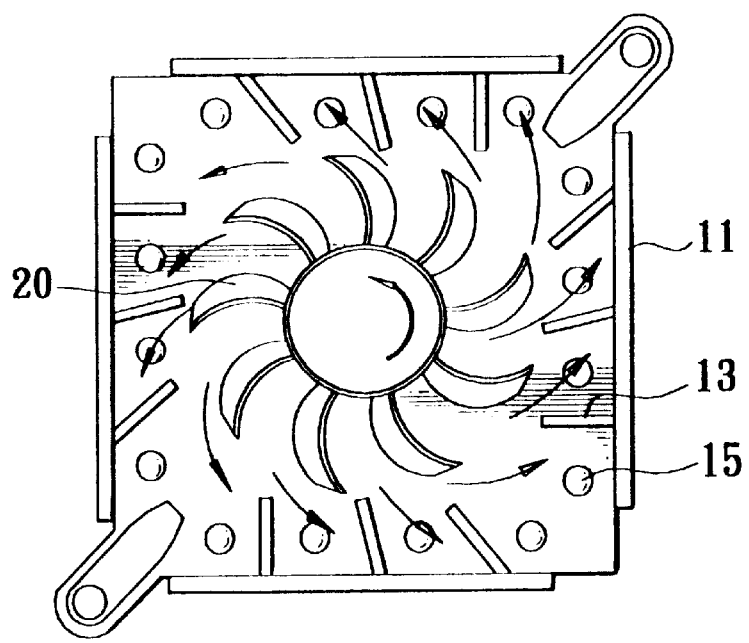
FIG. 5 is an orthographic drawing of the guided draft pattern of the invention herein.

Referring to FIG. 4 and FIG. 5, the isometric drawing of the assembled invention herein and the orthographic drawing of its guided draft pattern, respectively, when the fan 20 is spinning and impels the air stream towards the four lateral walls 11, the air stream moves past the flow direction separators 13 and is efficiently directed to the draft guide ducts 12; due to the included angle arrangement of the flow direction separators 13 and their influence on the whirling air path of the fan 20, deflective collisions and the generation of the reverse flow are prevented and, therefore, the flow direction separators 13 stem reverse flow and, furthermore, the included angles of their arrangement also effectively reduces the area of flow and significantly accelerates air stream flow speed such that air stream circulation becomes even smoother and, since the thermal dissipation protuberances 15 are situated within the air path created by the flow direction separators 13, thermal energy is continuously and rapidly dissipated.

The said drawings and component names have been adopted to facilitate the description of the invention herein and, furthermore, shall not be construed as a limitation on the patent claims of the present invention and all adaptations or modifications based on the innovative scope and structural components of the invention herein shall remain within the protected scope and claims of the invention herein.

In summation of the foregoing section, since the improved structure computer heat dissipater of the invention herein is a reasonably perfected invention that not only possesses excellent practicality, but also has a unique and unprecedented structural and spatial configuration design, original features and, furthermore, clearly increases heat dissipation speed and enhances heat dissipation performance, while being highly superior to the conventional technology and, furthermore, is not the simple extension of an existent idea, but a progressive innovation, therefore, the invention herein fully complies with all new patent application requirements and is hereby submitted to the patent bureau for review and granting of the commensurate patent rights.

What is claimed is:

1. An improved structure computer heat dissipater comprised of:

A heat sink base that is a square receptacle in physical construct having a recess formed in the center and a plurality of draft guide ducts cut inward through its four lateral walls, with the cut surfaces thereof bent towards the right to form flow direction separators and, furthermore, the said flow direction separators are oriented at different included angles ranging from approximately 90 degrees to 45 degrees relative to the rotational direction of a fan; thermal dissipation protuberances disposed on a bottom plate, with each situated at a front extent of said draft guide duct and, furthermore, positioned within the air path created by the said flow direction separators; said fan of an axial flow type that is pivotably installed in said cover and contained over the said recess; and a cover having an air intake opening formed in a top surface and a latch post extending downward from each of its two diagonally opposed corners, with each said latch post having at a bottom end an outwardly projecting hook that engages a upper extent of said heat sink base.

2. As mentioned in claim 1 of the improved structure computer heat dissipater invention herein, a tab projects horizontally from two sides at upper ends of each said lateral wall.

* * * * *